United States Patent [19]
Tang

[11] Patent Number: 5,585,285
[45] Date of Patent: Dec. 17, 1996

[54] METHOD OF FORMING DYNAMIC RANDOM ACCESS MEMORY CIRCUITRY USING SOI AND ISOLATION TRENCHES

[75] Inventor: Sanh Tang, Bosie, Id.

[73] Assignee: Micron Technology, Inc., Boise, Id.

[21] Appl. No.: 568,356

[22] Filed: Dec. 6, 1995

[51] Int. Cl.$^6$ .............................................. H01L 21/8242
[52] U.S. Cl. ................... 437/21; 437/60; 437/79; 437/203
[58] Field of Search .................. 437/21, 60, 67, 437/79, 203, 919; 148/DIG. 14, DIG. 50

[56] References Cited

U.S. PATENT DOCUMENTS

| | | | |
|---|---|---|---|
| 4,829,017 | 5/1989 | Malhi | 437/79 |
| 5,466,625 | 11/1995 | Hsieh et al. | 437/21 |
| 5,470,778 | 11/1995 | Nagata et al. | 437/203 |
| 5,504,027 | 4/1996 | Jeong et al. | 437/60 |

OTHER PUBLICATIONS

Nishihara, Toshiyuki et al., "A Buried Capacitor Cell With Bonded SOI For 256-Mbit and 1-Gbit DRAMs", Solid State Technology, Jun. 1994, pp. 89–94.

*Primary Examiner*—Chandra Chaudhari
*Attorney, Agent, or Firm*—Wells, St. John, Roberts, Gregory & Matkin, P.S.

[57] ABSTRACT

A semiconductor processing method of forming dynamic random access memory circuitry includes, a) providing an electrically conductive capacitor cell plate substrate; b) providing an electrically insulative layer over the cell plate; c) providing a layer of semiconductive material on the insulative layer thereby defining a semiconductor-on-insulator (SOI) layer; d) patterning and etching the SOI layer to define active area region islands and isolation trenches between the islands; e) filling the isolation trenches with insulative material; f) providing capacitor openings through the SOI layer and insulative layer into the cell plate substrate; g) providing a capacitor dielectric layer over the cell plate substrate within the capacitor openings; h) providing respective capacitor storage nodes over the dielectric layer within the capacitor openings, the respective storage nodes being in ohmic connection with the SOI layer; i) after providing the storage nodes, filling any remaining portions of the capacitor container openings with insulative material; j) providing a gate dielectric layer atop the SOI layer islands; k) providing conductive word lines over the gate dielectric layer on the islands and over the filled isolation trenches; l) providing opposing FET source and drain regions within the SOI layer; and m) providing bit lines outwardly of the word lines, the bit lines connecting with selected drain regions. Also contemplated is a DRAM array having sources and drains formed within an SOI layer, wherein capacitors of the array comprise trenches formed within a monocrystalline substrate, with the substrate comprising a common cell plate of the capacitors.

26 Claims, 7 Drawing Sheets

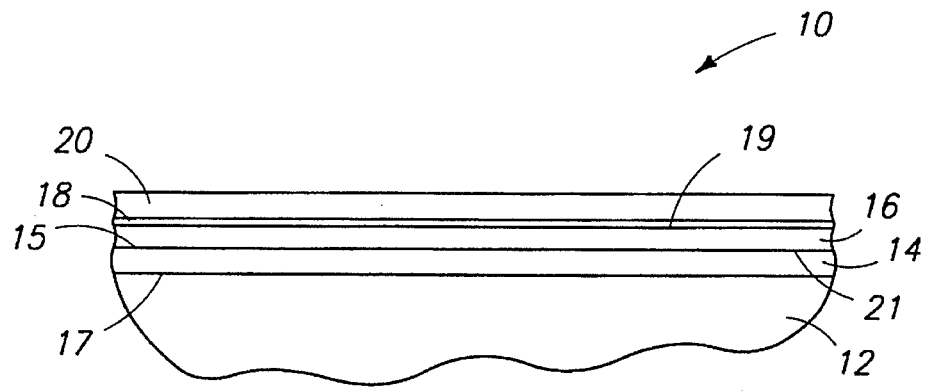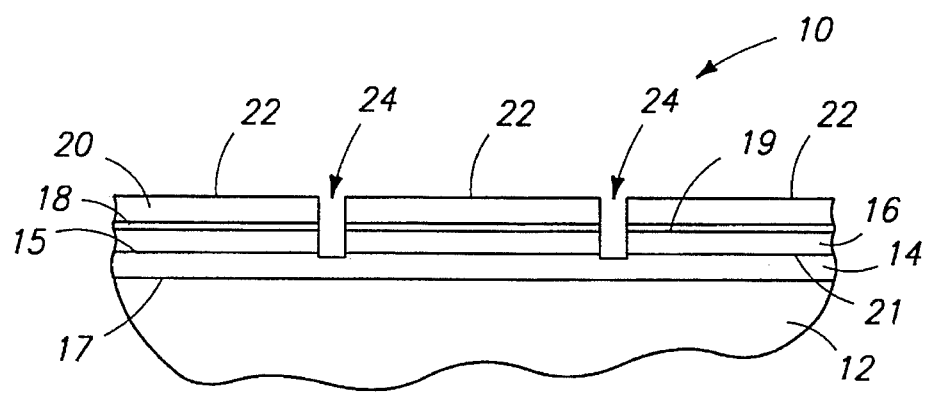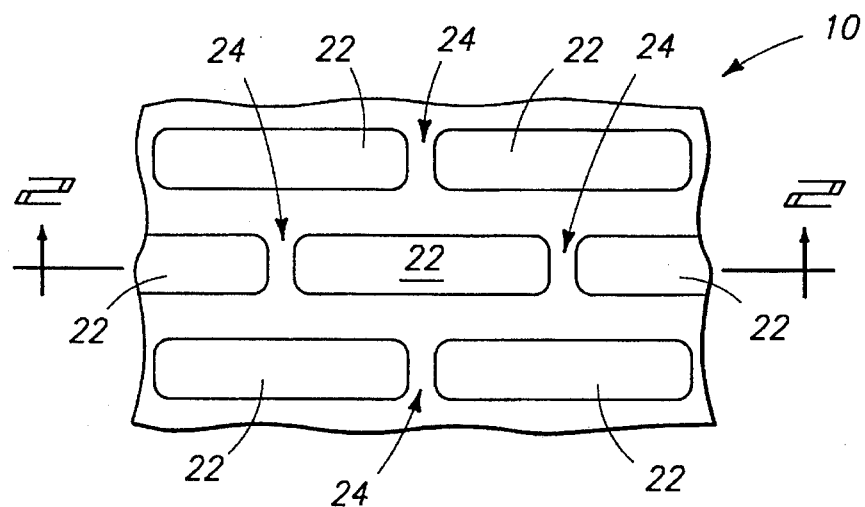

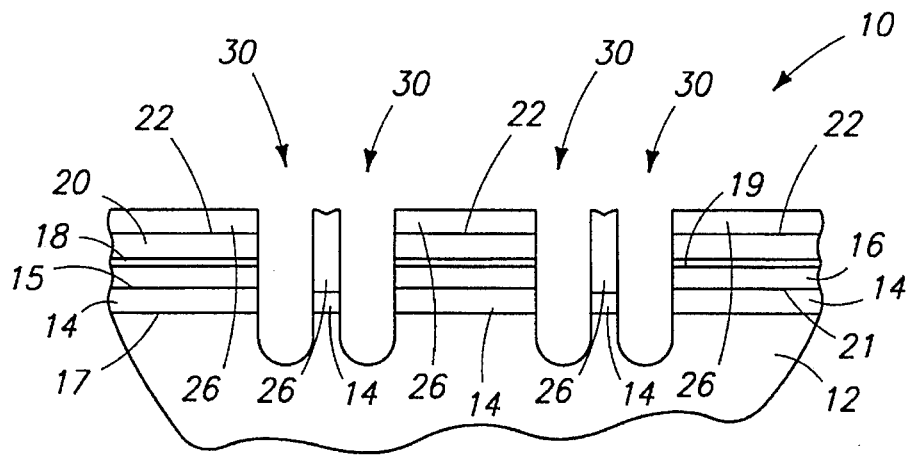
_Fig. 7_
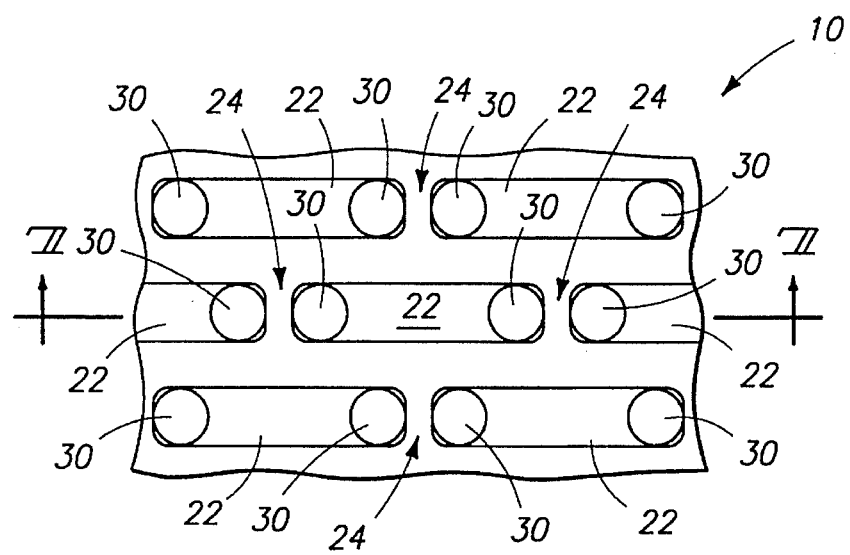
_Fig. 8_
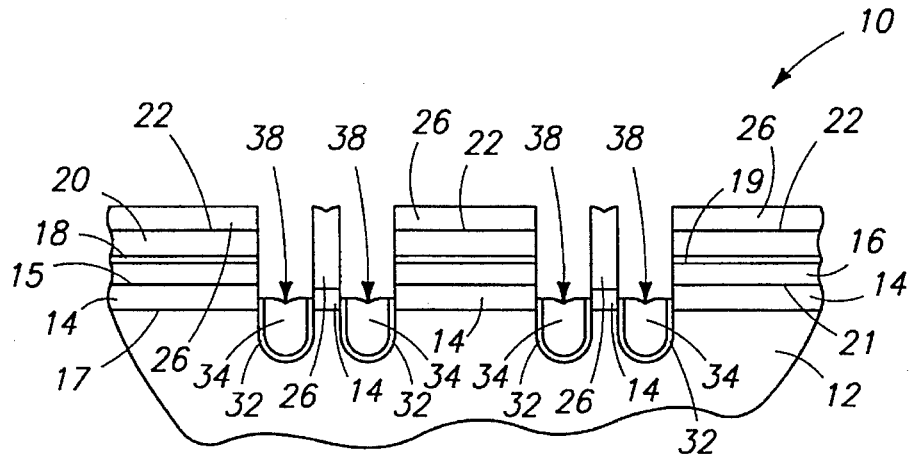
_Fig. 9_

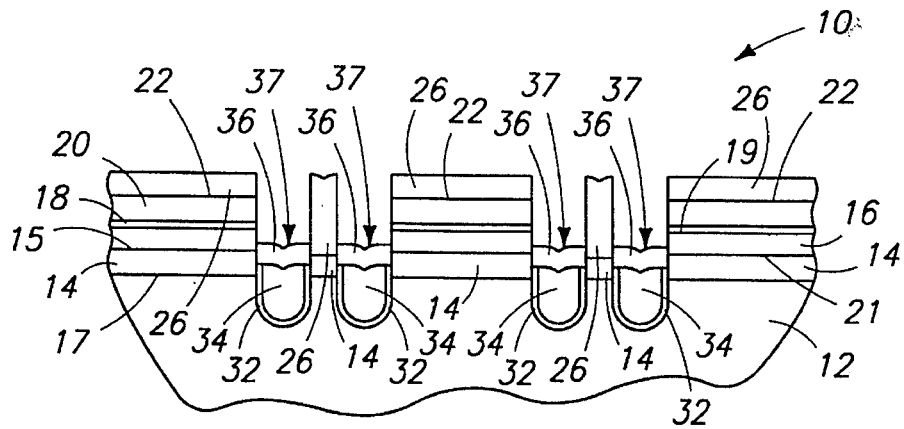
_Fig. 10_
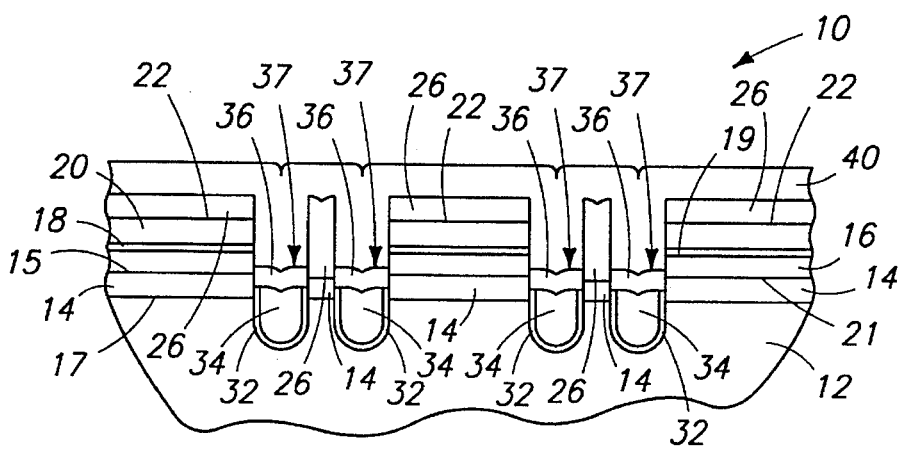
_Fig. 11_
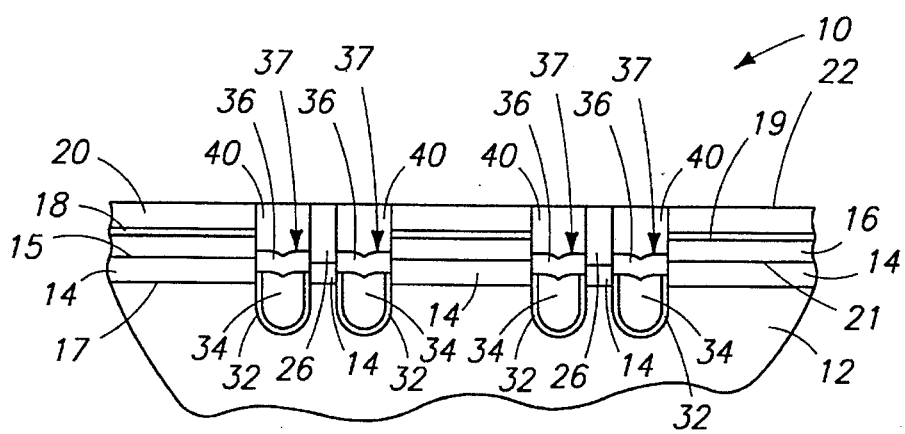
_Fig. 12_

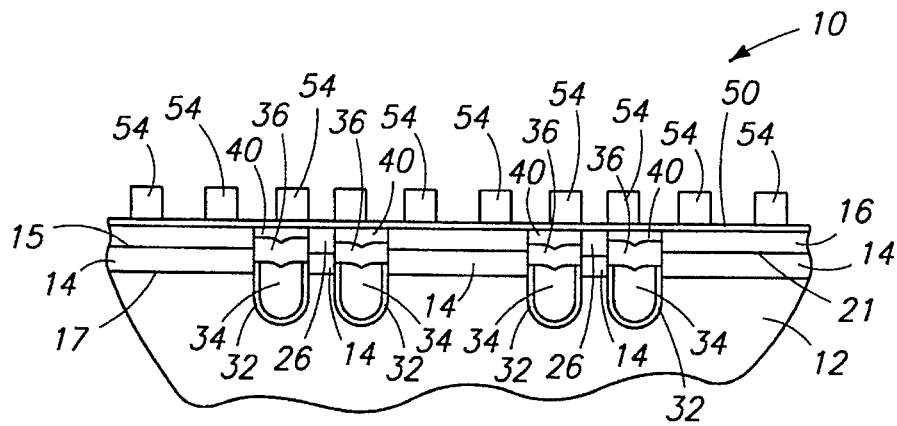
_FIG 16_
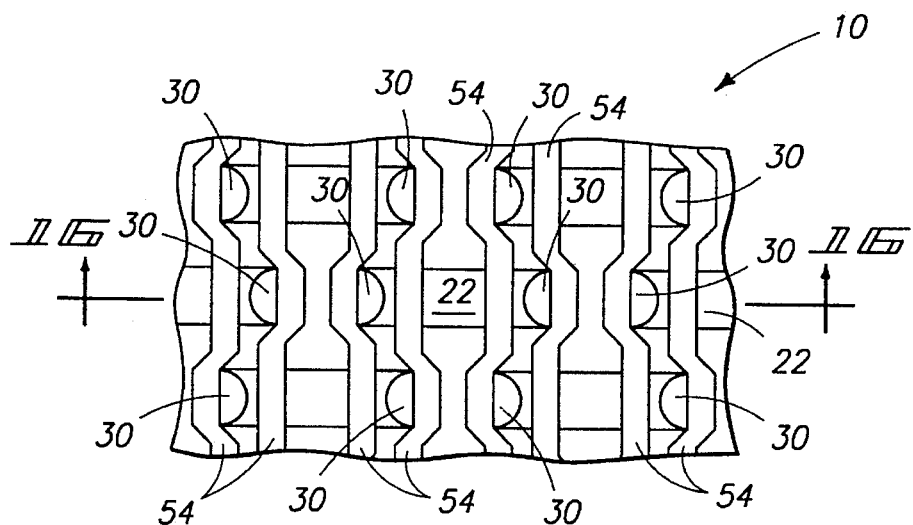
_FIG 17_
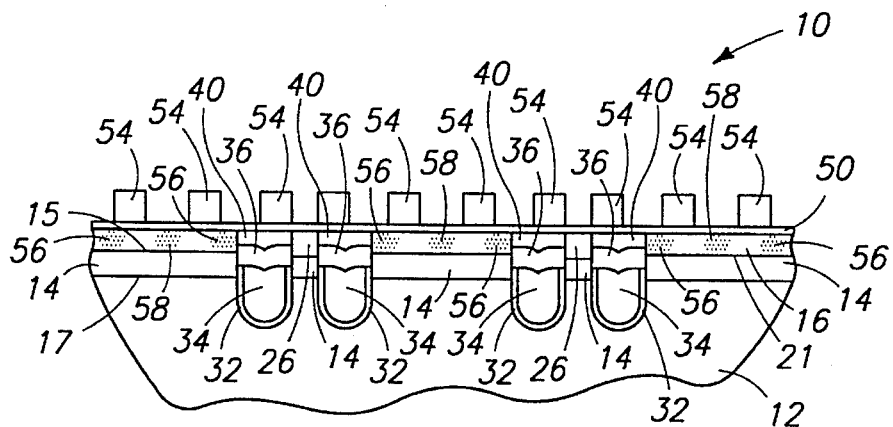
_FIG 18_

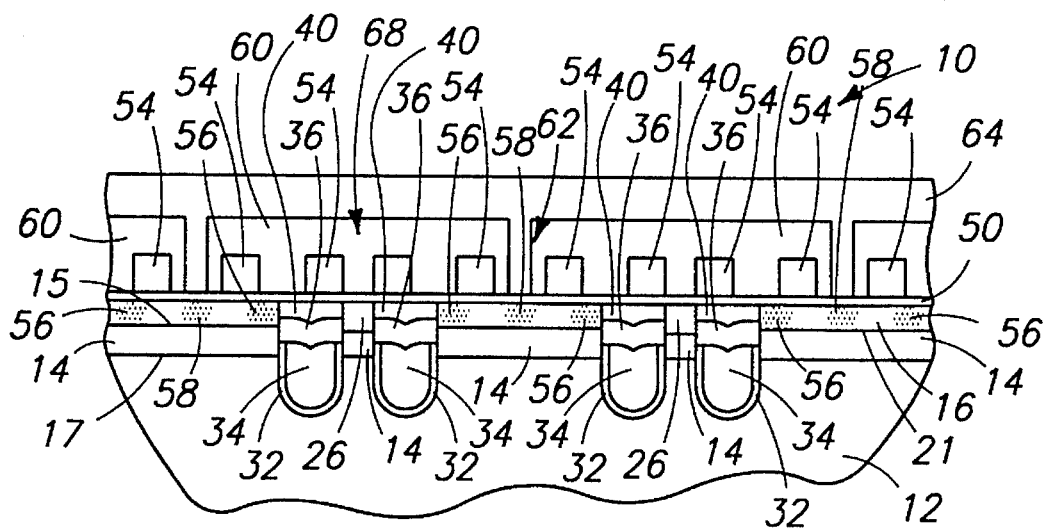
_FIG 19_
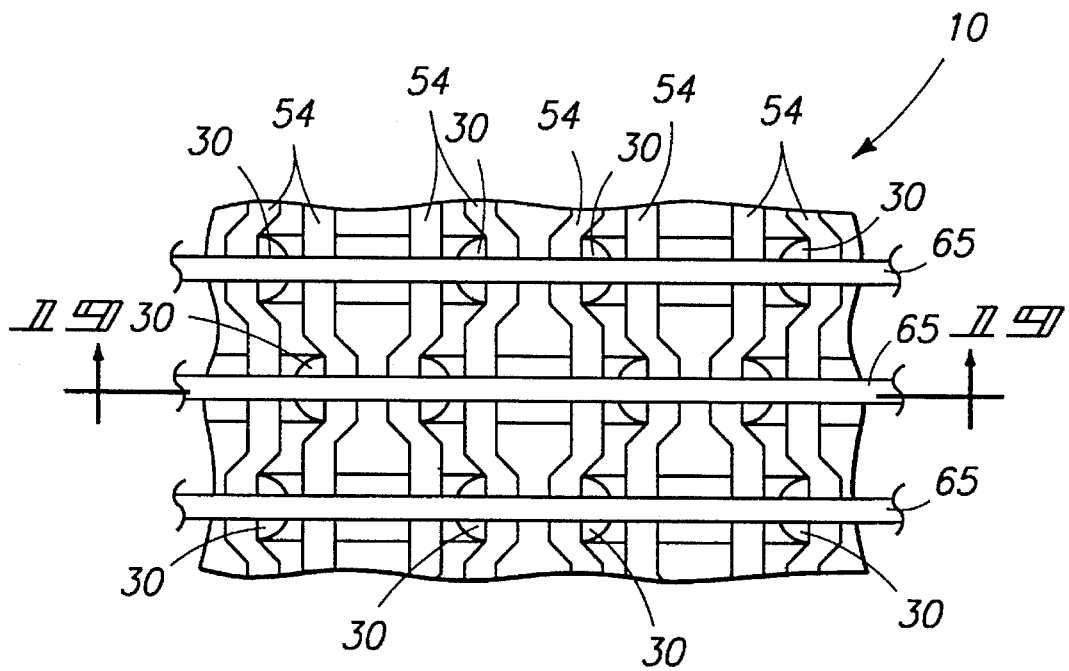
_FIG 20_

METHOD OF FORMING DYNAMIC RANDOM ACCESS MEMORY CIRCUITRY USING SOI AND ISOLATION TRENCHES

TECHNICAL FIELD

This invention relates to methods of forming dynamic random access memory circuitry and to dynamic random access memory circuitry.

BACKGROUND OF THE INVENTION

High density integrated circuitry is principally fabricated from semiconductor wafers. Upon fabrication completion, a wafer contains a plurality of identical discrete die areas which are ultimately cut from the wafer to form individual chips. Die areas or cut dies are tested for operability, with good dies being assembled into separate encapsulating packages which are used in end-products or systems.

One type of integrated circuitry comprises memory. The basic unit of semiconductor memory is the memory cell. Capable of storing a single bit of information, the memory cell has steadily shrunk in size to enable more and more cells per area of a semiconductor substrate or wafer. Such enables integrated memory circuitry to be more compact, as well as faster in operation.

Example semiconductor memories include ROMs, RAMs, PROMs, EPROMs and EEPROMs. Some emphasize compactness and economy over speed. Others focus on lightening-fast operation. Some store data indefinitely, while others are so temporary they must be refreshed hundreds of times every second. The smallest memory cell comprises the single transistor and single capacitor of a dynamic random access memory (DRAM).

BRIEF DESCRIPTION OF THE DRAWINGS

Preferred embodiments of the invention are described below with reference to the following accompanying drawings.

FIG. 1 is a diagrammatic fragmentary sectional view of a semiconductor wafer fragment at one processing step in accordance with the invention.

FIG. 2 is a view of the FIG. 1 wafer at a processing step subsequent to that shown by FIG. 1.

FIG. 3 is a top view of FIG. 2.

FIG. 7 is a view of the FIG. 1 wafer at a processing step subsequent to that shown by FIG. 6.

FIG. 8 is a top view of FIG. 7.

FIG. 9 is a view of the FIG. 1 wafer at a processing step subsequent to that shown by FIG. 7.

FIG. 10 is a view of the FIG. 1 wafer at a processing step subsequent to that shown by FIG. 9.

FIG. 11 is a view of the FIG. 1 wafer at a processing step subsequent to that shown by FIG. 10.

FIG. 12 is a view of the FIG. 1 wafer at a processing step subsequent to that shown by FIG. 11.

FIG. 16 is a view of the FIG. 1 wafer at a processing step subsequent to that shown by FIG. 17.

FIG. 17 is a top view of FIG. 16.

FIG. 18 is a view of the FIG. 1 wafer at a processing step subsequent to that shown by FIG. 16.

FIG. 19 is a view of the FIG. 1 wafer at a processing step subsequent to that shown by FIG. 18.

FIG. 20 is a top view of FIG. 19.

DETAILED DESCRIPTION OF THE PREFERRED EMBODIMENTS

Figure 4:
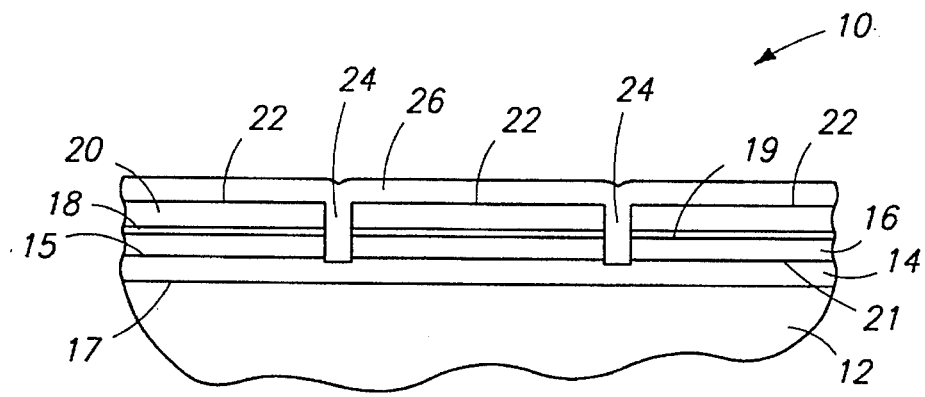
FIG. 4 is a view of the FIG. 1 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming dynamic random access memory circuitry comprises the following steps:

providing an electrically conductive capacitor cell plate substrate;

providing an electrically insulative layer over the cell plate;

providing a layer of semiconductive material on the electrically insulative layer thereby defining a semiconductor-on-insulator (SOI) layer;

patterning and etching the SOI layer to define active area region islands and isolation trenches between the islands;

filling the isolation trenches with electrically insulative material;

providing capacitor openings through the SOI layer and electrically insulative layer into the capacitor cell plate substrate;

providing a capacitor dielectric layer over the cell plate substrate within the capacitor openings;

providing respective capacitor storage nodes over the capacitor dielectric layer within the capacitor openings, the respective storage nodes being in ohmic electrical connection with the SOI layer;

after providing the capacitor storage nodes, filling any remaining portions of the capacitor container openings with electrically insulative material;

providing a gate dielectric layer atop the SOI layer islands;

providing electrically conductive word lines over the gate dielectric layer on the islands and over the filled isolation trenches;

providing opposing FET source and drain regions within the SOI layer; and providing bit lines outwardly of the word lines, the bit lines electrically connecting with selected drain regions.

In accordance with another aspect of the invention, a dynamic random access memory circuit array comprises:

an array of word lines and bit lines;

the word lines having associated source regions and drain regions;

the bit lines being in ohmic electrical connection with selected of the drain regions;

the source regions and the drain regions within the array being formed in a semiconductor-on-insulator layer;

a monocrystalline semiconductor substrate; the word lines, bit lines, source regions and drain regions being formed outwardly of the semiconductor substrate; and respective trench storage capacitors associated with selected of the silicon-on-insulator source regions; the trench capacitors respectively comprising a storage node plate, a capacitor dielectric layer and a cell plate; the storage node plates respectively comprising a trench formed within the monocrystalline semiconductor substrate and a conductive material within the trench; the respective capacitor dielectric layers being received within the respective trenches and interposed between the conductive material and monocrystalline semiconductor substrate; the cell plate comprising the monocrystalline semiconductor substrate.

More particularly with reference to the figures, FIG. 1 illustrates a semiconductor wafer fragment 10 at one step in a method of forming dynamic random access memory circuitry in accordance with the invention. Such comprises a lower electrically conductive layer 12. Layer 12 might comprise a conductively doped region of the bulk wafer substrate, or a separately deposited or provided conductive layer. In the preferred embodiment, layer 12 comprises a bulk substrate region of a monocrystalline semiconductor material, such as the bulk region of a monocrystalline silicon wafer. An example dopant concentration is $1 \times 10^{20}$ to $1 \times 10^{21}$ ions/cm$^3$. Regardless and in accordance with the preferred aspect of the invention, layer 12 constitutes an electrically conductive capacitor cell plate substrate.

An electrically insulative layer 14 is provided over cell plate 12. An example preferred material is silicon dioxide and deposited to a thickness of 3000 Angstroms. For purposes of the continuing discussion, insulative layer 14 includes an outer surface 15 and an inner surface 17. A layer 16 of semiconductive material is provided on electrically insulative layer 14, thereby defining a semiconductor-on-insulator (SOI) layer. Such preferably comprises conductively doped monocrystalline silicon deposited to an example thickness of 3000 Angstroms and having an intrinsic dopant impurity concentration of $1 \times 10^{15}$ ions/cm$^3$. For purposes of the continuing discussion, SOI layer 16 includes an outer surface 19 and an inner surface 21. The above described construction would preferably be provided for processing by purchasing the same from a silicon substrate vendor under a desired specification. A protective capping layer 18 is provided outwardly of SOI layer 16. An example and preferred material is silicon dioxide having a thickness of 250 Angstroms. Subsequently, an etch stop layer 20 is provided over capping layer 18, and thus over SOI layer 16. An example material is Si$_3$N$_4$ deposited to a thickness of 700 Angstroms.

Referring to FIGS. 2 and 3, SOI layer 16, capping layer 18 and etch stop layer 20 are patterned and etched to define active area region islands 22 and isolation trenches 24 between islands 22. Such isolation trenches 24 are preferably provided to effectively or substantially stop relative to electrically insulative layer 14.

Referring to FIG. 4, isolation trenches 24 are filled with an electrically insulative material preferably by depositing an electrically insulative layer 26. Again, a preferred material for layer 26 is doped or undoped SiO$_2$, deposited to a thickness effective to assure complete filling of trenches 24. An example deposited thickness is 1000 Angstroms.

Figure 5:
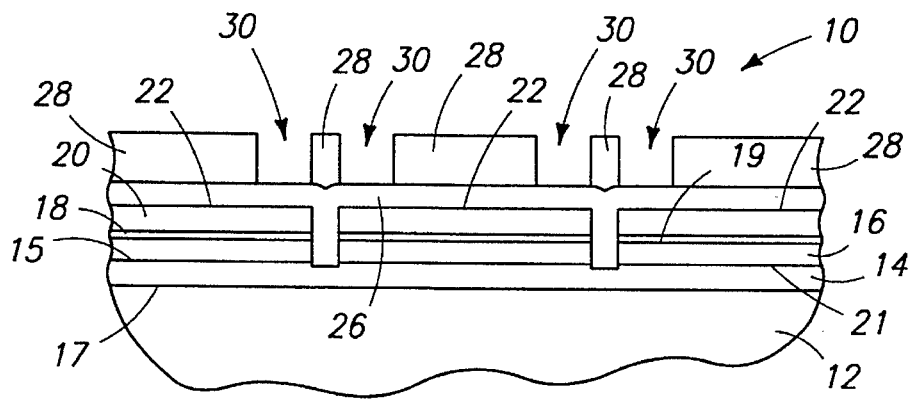
FIG. 5 is a view of the FIG. 1 wafer at a processing step subsequent to that shown by FIG. 4.
Figure 6:
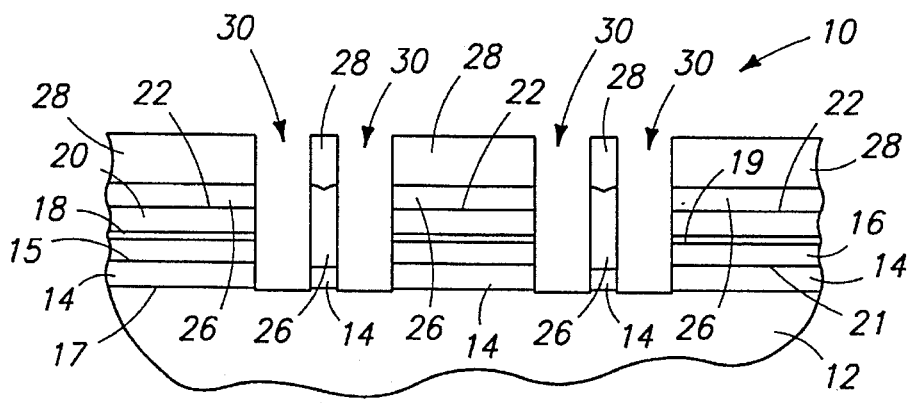
FIG. 6 is a view of the FIG. 1 wafer at a processing step subsequent to that shown by FIG. 5.

Capacitor openings are provided through the SOI layer and electrically insulative layer into the capacitor cell plate substrate. Preferably, and initially with reference to FIG. 5, such is accomplished by initially depositing and patterning a layer of photoresist 28 over insulating layer 26 filling isolation trenches 24 to define a pattern of openings 30 which will comprise resultant capacitor openings. Referring to FIG. 6, and with photoresist layer 28 in place, etching is conducted through insulating layer 26, etch stop layer 20, capping layer 18, SOI layer 16 and electrically insulative layer 14 substantially stopping on capacitor cell plate substrate 12.

Referring to FIGS. 7 and 8, photoresist layer 28 is stripped from outwardly of insulating layer 26, and the wafer then subjected to a clean step. Subsequently, cell plate substrate 12 is etched into using insulating layer 26 filling isolation trenches 24 as a hard mask for such cell plate etching. It is preferred to strip the photoresist before subsequent etching of silicon within substrate 12 to avoid resist or other material contaminating the container opening and the underlying silicon.

Referring to FIG. 9, a capacitor dielectric layer 32 is deposited or grown within capacitor openings 30 over cell plate substrate 12. An example and preferred composition for layer 32 is a sandwich of oxide-nitride-oxide. An example preferred thickness is from 80 Angstroms to 100 Angstroms. Subsequently, a first conductive layer 34 is provided over capacitor dielectric layer 32 within capacitor openings 30. Such preferably comprises in situ conductively doped polysilicon which is deposited to fill the respective capacitor openings 30. Thereafter, such layer is etched as indicated to stop below upper surface 15 of electrically insulative layer 14, but above bottom surface 17 of insulative layer 14. Thus, the first conductive layer 34 has an outer surface 38 which is positioned between outer and inner surfaces 15 and 17, respectively, of electrically insulative layer 14.

Referring to FIG. 10, a second electrically conductive layer 36, preferably again in situ conductively doped polysilicon, is provided within capacitor openings 30 in ohmic electrical connection with first conductive layer 34 and with SOI layer 16. Layer 36 is subsequently etched back to provide an outer second conductive layer surface 37 which is positioned below SOI layer outer surface 19, yet above SOI layer 16 inner surface 21. Thus, conductive layers 34 and 36 constitute but one example method of providing respective capacitor storage nodes over capacitor dielectric layers 32 within capacitor openings 30 which are in ohmic electrical connection with SOI layer 16.

Referring to FIG. 11, a layer 40 of electrically insulating material is deposited to fill any remaining portions of capacitor container openings 30 with an electrically insulative material. Such material preferably, again, comprises doped or undoped SiO$_2$.

Referring to FIG. 12, electrically insulative layer 40 and electrically insulative layer 26 are etched in a common step using etch stop layer 20 as an etch stop to such etching. Example and preferred techniques include resist etch back, or chemical-mechanical polishing.

Figure 13:
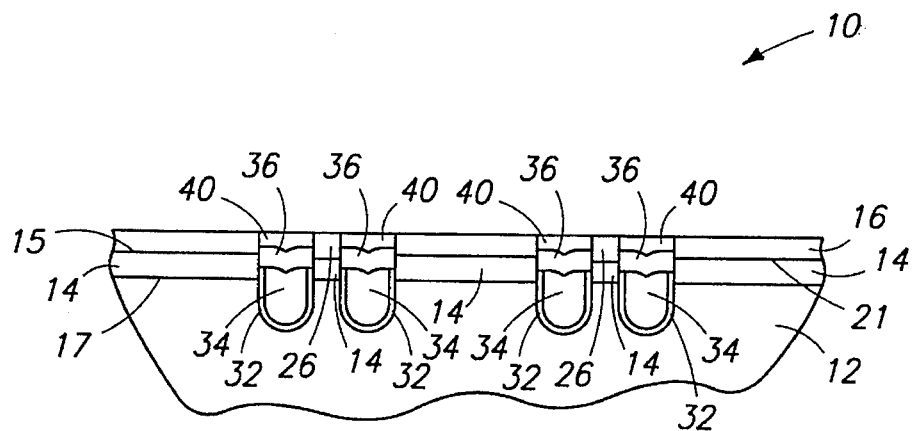
FIG. 13 is a view of the FIG. 1 wafer at a processing step subsequent to that shown by FIG. 12.

Referring to FIG. 13, further etching or chemical-mechanical polishing is conducted in a manner effective to remove etch stop layer 20 and capping layer 18 from SOI layer islands 22, effectively stopping on SOI layer 16.

Figure 14:
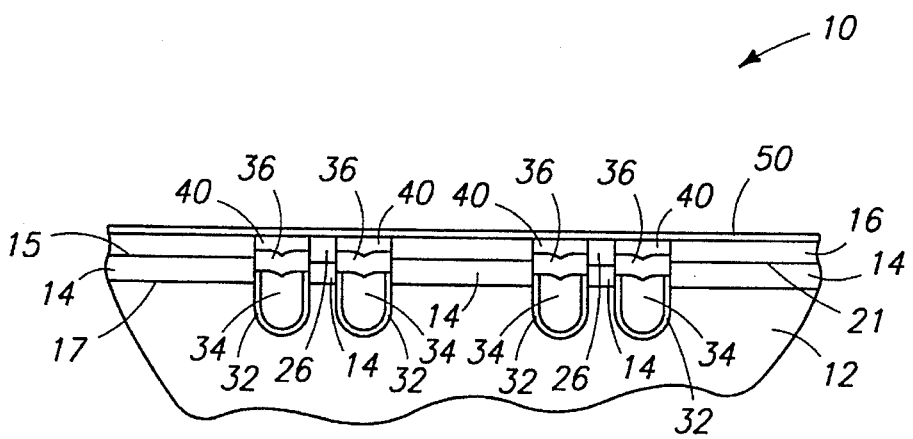
FIG. 14 is a view of the FIG. 1 wafer at a processing step subsequent to that shown by FIG. 13.

Referring to FIG. 14, a gate dielectric layer 50 is provided atop SOI layer islands 22 over SOI layer 16. Such preferably comprises SiO$_2$, with an example thickness being 60 Angstroms to 80 Angstroms.

Figure 15:
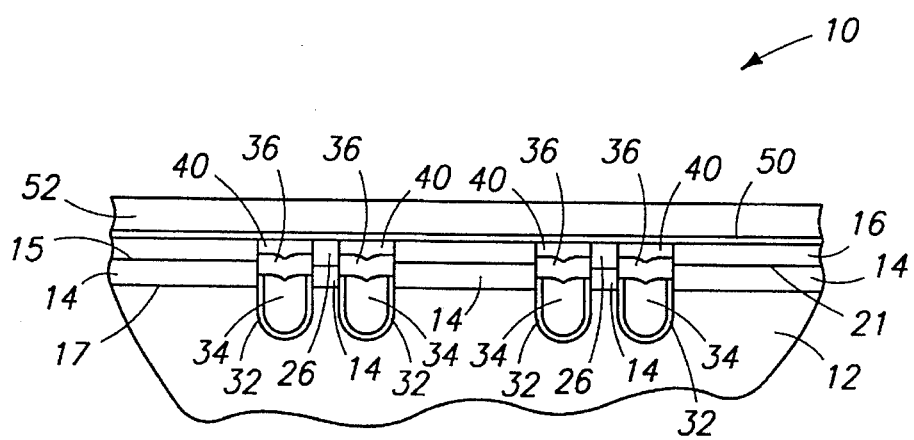
FIG. 15 is a view of the FIG. 1 wafer at a processing step subsequent to that shown by FIG. 14.

Referring to FIG. 15, an electrically conductive layer 52 is deposited over gate dielectric layer 50. Such preferably comprises conductively doped polysilicon having a metal cap provided thereover for formation of a higher conductive metal silicide cap.

Referring to FIGS. 16 and 17, electrically conductive layer 52 is patterned to define an array of word lines 54 over gate dielectric layer 50 on islands 22 and over filled isolation trenches 24.

Referring to FIG. 18, appropriate masking is conducted to provide opposing FET source regions 56 and drain regions 58 within SOI layer 16. LDD or other halo implant regions and/or anisotropically etched sidewall spacers could of course be provided as desired by the artisan.

Referring to FIGS. 19 and 20, a planarized electrically insulating layer 60 is provided, and bit contact opening 62 provided therein to drain regions 58. A layer of electrically conductive material 64 is subsequently deposited and patterned to define an array of bit lines 65 outwardly of word lines 54, with bit lines 65 electrically connecting with selected drain regions 58 through contact openings 62.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming dynamic random access memory circuitry comprising the following steps:

providing an electrically conductive capacitor cell plate substrate;

providing an electrically insulative layer over the cell plate;

providing a layer of semiconductive material on the electrically insulative layer thereby defining a semiconductor-on-insulator (SOI) layer;

patterning and etching the SOI layer to define active area region islands and isolation trenches between the islands;

filling the isolation trenches with electrically insulative material;

providing capacitor openings through the SOI layer and electrically insulative layer into the capacitor cell plate substrate;

providing a capacitor dielectric layer over the cell plate substrate within the capacitor openings;

providing respective capacitor storage nodes over the capacitor dielectric layer within the capacitor openings, the respective storage nodes being in ohmic electrical connection with the SOI layer;

after providing the capacitor storage nodes, filling any remaining portions of the capacitor container openings with electrically insulative material;

providing a gate dielectric layer atop the SOI layer islands;

providing electrically conductive word lines over the gate dielectric layer on the islands and over the filled isolation trenches;

providing opposing FET source and drain regions within the SOI layer; and providing bit lines outwardly of the word lines, the bit lines electrically connecting with selected drain regions.

2. The semiconductor processing method of claim 1 further comprising providing a protective capping layer over the SOI layer before defining the active area region islands and isolation trenches, and removing the protective capping layer from the SOI layer islands prior to providing the gate dielectric layer atop the SOI layer islands.

3. The semiconductor processing method of claim 1 further comprising providing an etch stop layer over the SOI layer, the steps of filling the isolation trenches and remaining portions of the capacitor contact openings comprising depositing respective layers of insulating material and subsequently etching such layers in a common step using the etch stop layer as an etch stop to such etching.

4. The semiconductor processing method of claim 3 wherein the common step etching is conducted by chemical-mechanical polishing.

5. The semiconductor processing method of claim 1 further comprising providing a protective capping layer over the SOI layer before defining the active area region islands and isolation trenches, and removing the protective capping layer from the SOI layer islands prior to providing the gate dielectric layer atop the SOI layer islands; and further comprising providing an etch stop layer over the protective capping layer, the steps of filling the isolation trenches and remaining portions of the capacitor contact openings comprising depositing respective layers of insulating material and subsequently etching such layers in a common step using the etch stop layer as an etch stop to such etching.

6. The semiconductor processing method of claim 1 wherein the islands and trenches are formed before providing the capacitor openings.

7. The semiconductor processing method of claim 1 wherein the isolation trenches are filled by depositing an insulating layer, the step of providing the capacitor openings sequentially comprising:

depositing and patterning photoresist over the insulating layer to define a pattern for such capacitor openings;

with the photoresist in place, etching through the insulating layer and the SOI layer stopping on the capacitor cell plate substrate;

stripping the photoresist from outwardly of the insulating layer; and etching into the cell plate substrate using the insulating layer as a hard mask for such cell plate etching.

8. The semiconductor processing method of claim 1 wherein the electrically insulative layer has an outer surface and an inner surface, the step of providing the capacitor storage nodes comprises providing a first conductive layer to within the respective capacitor openings, the first conductive layer having an outer surface which is positioned between the outer and inner surfaces of the electrically insulative layer; and providing a second conductive layer within the respective capacitor openings in ohmic electrical connection with the first conductive layer and with the SOI layer.

9. The semiconductor processing method of claim 1 wherein the SOI layer has an outer surface, the respective capacitor storage nodes have an outer surface which is positioned below the SOI layer outer surface.

10. The semiconductor processing method of claim 1 wherein the electrically insulative layer has an outer surface and an inner surface, the step of providing the capacitor storage nodes comprises providing a first conductive layer to within the respective capacitor openings, the first conductive layer having an outer surface which is positioned between the outer and inner surfaces of the electrically insulative layer; and providing a second conductive layer within the respective capacitor openings in ohmic electrical connection with the first conductive layer and with the SOI layer; and wherein the SOI layer has an outer surface, the second conductive layer having an outer surface which is positioned below the SOI layer outer surface.

11. The semiconductor processing method of claim 1 wherein the capacitor cell plate substrate comprises a bulk substrate region of a semiconductor material wafer.

12. A dynamic random access memory circuit array produced according to the process of claim 1.

13. A dynamic random access memory circuit array produced according to the process of claim 11.

14. A semiconductor processing method of forming dynamic random access memory circuitry comprising the following steps:

providing an electrically conductive capacitor cell plate substrate;

providing an electrically insulative layer over the cell plate;

providing a layer of semiconductive material on the electrically insulative layer thereby defining a semiconductor-on-insulator (SOI) layer;

providing a protective capping layer over the SOI layer;

providing an etch stop layer over the SOI layer;

patterning and etching the SOI layer, etch stop layer and capping layer to define active area region islands and isolation trenches between the islands;

filling the isolation trenches with electrically insulative material;

after forming the active area region islands and isolation trenches between the islands, providing capacitor openings through the SOI layer and electrically insulative layer into the capacitor cell plate substrate;

providing a capacitor dielectric layer over the cell plate substrate within the capacitor openings;

providing respective capacitor storage nodes over the capacitor dielectric layer within the capacitor openings, the respective storage nodes being in ohmic electrical connection with the SOI layer;

after providing the capacitor storage nodes, filling any remaining portions of the capacitor container openings with electrically insulative material;

the steps of filling the isolation trenches and remaining portions of the capacitor contact openings comprising depositing respective layers of insulating material and subsequently etching such layers in a common step using the etch stop layer as an etch stop to such etching;

removing the protective capping layer from the SOI layer islands;

after removing the protective capping layer, providing a gate dielectric layer atop the SOI layer islands;

providing electrically conductive word lines over the gate dielectric layer on the islands and over the filled isolation trenches;

providing opposing FET source and drain regions within the SOI layer; and providing bit lines outwardly of the word lines, the bit lines electrically connecting with selected drain regions.

15. The semiconductor processing method of claim 14 wherein the common step etching is conducted by chemical-mechanical polishing.

16. The semiconductor processing method of claim 14 wherein the step of providing the capacitor openings sequentially comprises:

depositing and patterning photoresist over the insulating layer filling the isolation trenches to define a pattern for such capacitor openings;

with the photoresist in place, etching through the insulating layer filling the isolation trenches and the SOI layer stopping on the capacitor cell plate substrate;

stripping the photoresist from outwardly of the insulating layer filling the isolation trenches; and etching into the cell plate substrate using the insulating layer filling the isolation trenches as a hard mask for such cell plate etching.

17. The semiconductor processing method of claim 14 wherein the electrically insulative layer has an outer surface and an inner surface, the step of providing the capacitor storage nodes comprises providing a first conductive layer to within the respective capacitor openings, the first conductive layer having an outer surface which is positioned between the outer and inner surfaces of the electrically insulative layer; and providing a second conductive layer within the respective capacitor openings in ohmic electrical connection with the first conductive layer and with the SOI layer.

18. The semiconductor processing method of claim 14 wherein the SOI layer has an outer surface, the respective capacitor storage nodes have an outer surface which is positioned below the SOI layer outer surface.

19. The semiconductor processing method of claim 14 wherein the electrically insulative layer has an outer surface and an inner surface, the step of providing the capacitor storage nodes comprises providing a first conductive layer to within the respective capacitor openings, the first conductive layer having an outer surface which is positioned between the outer and inner surfaces of the electrically insulative layer; and providing a second conductive layer within the respective capacitor openings in ohmic electrical connection with the first conductive layer and with the SOI layer; and wherein the SOI layer has an outer surface, the second conductive layer having an outer surface which is positioned below the SOI layer outer surface.

20. The semiconductor processing method of claim 14 wherein the step of providing the capacitor openings sequentially comprises:

depositing and patterning photoresist over the insulating layer filling the isolation trenches to define a pattern for such capacitor openings;

with the photoresist in place, etching through the insulating layer filling the isolation trenches and the SOI layer stopping on the capacitor cell plate substrate;

stripping the photoresist from outwardly of the insulating layer filling the isolation trenches; and etching into the cell plate substrate using the insulating layer filling the isolation trenches as a hard mask for such cell plate etching; and wherein the electrically insulative layer has an outer surface and an inner surface, the step of providing the capacitor storage nodes comprises providing a first conductive layer to within the respective capacitor openings, the first conductive layer having an outer surface which is positioned between the outer and inner surfaces of the electrically insulative layer; and providing a second conductive layer within the respective capacitor openings in ohmic electrical connection with the first conductive layer and with the SOI layer.

21. The semiconductor processing method of claim 14 wherein the step of providing the capacitor openings sequentially comprises:

depositing and patterning photoresist over the insulating layer filling the isolation trenches to define a pattern for such capacitor openings;

with the photoresist in place, etching through the insulating layer filling the isolation trenches and the SOI layer stopping on the capacitor cell plate substrate;

stripping the photoresist from outwardly of the insulating layer filling the isolation trenches; and etching into the cell plate substrate using the insulating layer filling the isolation trenches as a hard mask for such cell plate etching; and wherein the SOI layer has an outer surface, the respective capacitor storage nodes have an outer surface which is positioned below the SOI layer outer surface.

22. The semiconductor processing method of claim 14 wherein the step of providing the capacitor openings sequentially comprises:

depositing and patterning photoresist over the insulating layer filling the isolation trenches to define a pattern for such capacitor openings;

with the photoresist in place, etching through the insulating layer filling the isolation trenches and the SOI layer stopping on the capacitor cell plate substrate;

stripping the photoresist from outwardly of the insulating layer filling the isolation trenches; and etching into the cell plate substrate using the insulating layer filling the isolation trenches as a hard mask for such cell plate etching;

wherein the SOI layer has an outer surface, the respective capacitor storage nodes have an outer surface which is positioned below the SOI layer outer surface; and wherein the electrically insulative layer has an outer surface and an inner surface, the step of providing the capacitor storage nodes comprises providing a first conductive layer to within the respective capacitor openings, the first conductive layer having an outer surface which is positioned between the outer and inner surfaces of the electrically insulative layer; and providing a second conductive layer within the respective capacitor openings in ohmic electrical connection with the first conductive layer and with the SOI layer.

23. The semiconductor processing method of claim 14 wherein the step of providing the capacitor openings sequentially comprises:

depositing and patterning photoresist over the insulating layer filling the isolation trenches to define a pattern for such capacitor openings;

with the photoresist in place, etching through the insulating layer filling the isolation trenches and the SOI layer stopping on the capacitor cell plate substrate;

stripping the photoresist from outwardly of the insulating layer filling the isolation trenches; and etching into the cell plate substrate using the insulating layer filling the isolation trenches as a hard mask for such cell plate etching; and wherein the electrically insulative layer has an outer surface and an inner surface, the step of providing the capacitor storage nodes comprises providing a first conductive layer to within the respective capacitor openings, the first conductive layer having an outer surface which is positioned between the outer and inner surfaces of the electrically insulative layer; and providing a second conductive layer within the respective capacitor openings in ohmic electrical connection with the first conductive layer and with the SOI layer; and wherein the SOI layer has an outer surface, the second conductive layer having an outer surface which is positioned below the SOI layer outer surface.

24. The semiconductor processing method of claim 14 wherein the capacitor cell plate substrate comprises a bulk substrate region of a semiconductor material wafer.

25. A dynamic random access memory circuit array produced according to the process of claim 14.

26. A dynamic random access memory circuit array produced according to the process of claim 24.

* * * * *